(12) United States Patent
Naseem et al.

(10) Patent No.: US 10,559,524 B1
(45) Date of Patent: Feb. 11, 2020

(54) 2-STEP DIE ATTACH FOR REDUCED PEDESTAL SIZE OF LAMINATE COMPONENT PACKAGES

(71) Applicant: Texas Instruments Incorporated, Dallas, TX (US)

(72) Inventors: Sadia Naseem, Dallas, TX (US); Vikas Gupta, Dallas, TX (US); Rongwei Zhang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/133,117

(22) Filed: Sep. 17, 2018

(51) Int. Cl.
| | |
|---|---|
| *H01L 21/00* | (2006.01) |
| *H01L 29/00* | (2006.01) |
| *H01L 23/12* | (2006.01) |
| *H01L 23/495* | (2006.01) |
| *H01L 23/64* | (2006.01) |
| *H01L 23/00* | (2006.01) |
| *H01L 21/56* | (2006.01) |
| *H01F 27/28* | (2006.01) |

(52) U.S. Cl.
CPC ... *H01L 23/49541* (2013.01); *H01F 27/2804* (2013.01); *H01L 21/565* (2013.01); *H01L 23/49513* (2013.01); *H01L 23/49575* (2013.01); *H01L 23/645* (2013.01); *H01L 24/49* (2013.01); *H01L 24/85* (2013.01); *H01F 2027/2809* (2013.01); *H01L 2224/48091* (2013.01); *H01L 2224/48195* (2013.01); *H01L 2224/48247* (2013.01)

(58) Field of Classification Search
CPC ............. H01L 21/565; H01L 23/49541; H01L 23/49513; H01L 23/49575
USPC .................................... 438/51; 257/731, 531
See application file for complete search history.

(56) References Cited

U.S. PATENT DOCUMENTS

| | | | |
|---|---|---|---|
| 9,741,677 B1 * | 8/2017 | Strutz | ..................... H01L 24/29 |
| 2014/0353772 A1 * | 12/2014 | Stermer, Jr. | ......... B81C 1/00325 |
| | | | 257/415 |
| 2015/0069572 A1 | 3/2015 | Khanolkar et al. | |
| 2019/0259685 A1 * | 8/2019 | Hussain | .............. H01L 23/3114 |

* cited by examiner

*Primary Examiner* — David S Blum
(74) *Attorney, Agent, or Firm* — Ronald O. Neerings; Charles A. Brill; Frank D. Cimino

(57) ABSTRACT

A packaged semiconductor device includes a leadframe (LF) having a plurality of laminate-supporting pedestals. A cured first die attach (DA) material is on an outer edge of the pedestals being an ultraviolet (UV)-curing DA material having a photoinitiator or a cured B-stage DA material. A cured thermally-curing DA material is on an area of the pedestals not occupied by the UV-curing DA material. A laminate component having bond pads on a top side is mounted top side up on the plurality of pedestals.

30 Claims, 4 Drawing Sheets

2-STEP DIE ATTACH FOR REDUCED PEDESTAL SIZE OF LAMINATE COMPONENT PACKAGES

FIELD

This Disclosure relates to the die attach in semiconductor packaging and packaged semiconductor devices that include a laminate component attached to pedestals of a leadframe.

BACKGROUND

A variety of semiconductor chip packages are known. One conventional package configuration includes a leadframe (LF) having at least one die pad for mounting a die or other devices and wire bond pads. Laminate devices, which may include laminate components such as transformers or high voltage (HV) capacitors, may be attached to LFs, such as for certain digital isolation devices.

LF designs for laminate containing packages often include pedestals to physically support the laminate component. In order to enhance the functionality of the laminate component, the clearance (or minimum distance) between the metal layers of the laminate component and the closest LF structure, is typically a package design consideration due to potential electric field interactions that can damage dielectric materials located between the laminate component and the LF.

This clearance can be reduced through pedestal area miniaturization so that the feature size in the metal layers of the laminate component can be increased, which improves the performance of the laminate component. However, this comes with a tradeoff where the laminate components would have less surface area on the pedestals to adhere to, and uncured die attach (DA) material generally does not have sufficient tackiness to properly hold the laminate component in place after laminate component mounting but before its DA material cure. Laminate components have been found to come off or otherwise be displaced during the physical transportation of LF strips from the device mounting tool to the DA cure processing tool (e.g., an oven), resulting in scrapped semiconductor packages, including sometimes scrapping all the in-process devices on the entire LF strip.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes there are no known solutions that enable the reliable usage of reduced area LF pedestals to enable the feature size in the metal layers of the laminate component to be increased to enhance the performance of laminate components and associated packaged devices. Generally, pedestals of a minimum area (e.g., each with a minimum area of say X $\mu m^2$) are used to mechanically support a particular laminate component generally based on its area, but this comes with a device functionality limitation due to the above-described clearance needed between the closest metal features of the laminate component, such as metal coils of a laminate transformer and the LF edge, generally being half-etch features on the edge of pedestals.

The Disclosure solves this functionality limitation in laminate-containing LF-based devices by a disclosed two-step DA dispense that uses different DA materials. Disclosed DA methods provide sufficient mechanical stability for the laminate component to be transported from device mount apparatus to DA cure apparatus that enables utilization of smaller area LF pedestals, such as being 0.7× to 0.85×$\mu m^2$ in area.

Disclosed aspects include a packaged semiconductor device, which includes a LF having a plurality of laminate-supporting pedestals. A cured first DA material is on an outer edge of the pedestals being an ultraviolet (UV)-curing DA material having a photoinitiator or a cured B-stage DA material. A cured thermally-curing DA material is on an area of the pedestals not occupied by the UV-curing DA material. A laminate component having bond pads on its top side is mounted with its top side up on the plurality of pedestals.

BRIEF DESCRIPTION OF THE DRAWINGS

Reference will now be made to the accompanying drawings, which are not necessarily drawn to scale, wherein.

DETAILED DESCRIPTION

Figure 1:
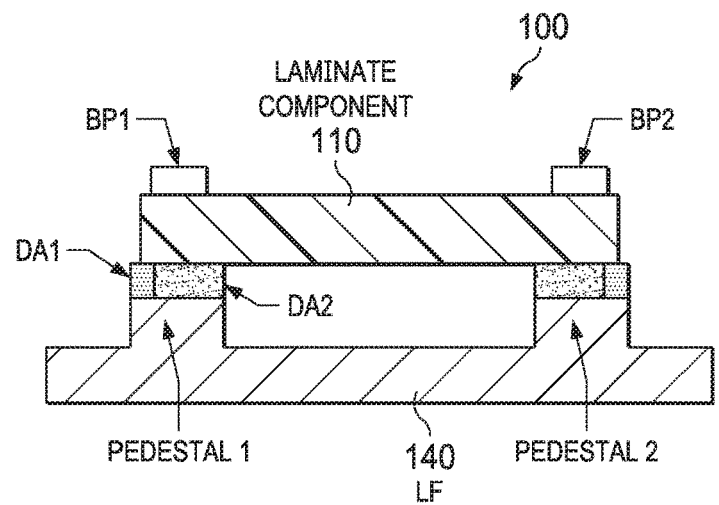
FIG. 1 is a cross sectional depiction of a packaged semiconductor device showing a laminate component secured to pedestals of a LF with 2-different DA materials that follows a disclosed DA method which enables reduced area pedestals for the mounting of laminate components, according to an example aspect.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Disclosed aspects include a method of assembling a packaged semiconductor device that includes 2 different DA materials for mounting a laminate component on reduced area pedestals of LFs for forming packaged semiconductor devices. After applying (e.g., printing or dispensing) a first DA material comprising an ultraviolet (UV)-curing DA material or B-stage DA material on an outer edge or as an outer ring of DA material on the pedestals of a plurality of LFs that are part of a LF strip, a thermally-curing DA material is applied on areas of the pedestals not occupied by the first DA material.

The respective DA materials can be electrically conductive or electrically non-conductive materials. The thickness ranges for the respective DA materials are both generally 5 µm to 50 µm, such as each being typically about 25 µm thick. The thermally-curing DA material and the UV-curing DA material can both be one of the three types of resins generally used in semiconductor assembly comprising an epoxy resin, a acrylate resin, or a bismaleimide resin, or one of their combinations. In one particular arrangement, the thermally-curing DA material and the UV-curing DA material both comprise epoxy resins, with only the UV curing DA material including a UV photoinitiator.

A laminate component is then mounted top side (the side where its electrode contacts are) on the pedestal. In the case the first DA material is the UV-curing DA material, the UV-curing DA material is UV cured to provide additional mechanical stability for the laminate components on the pedestals of the LF to be transported from the device mount apparatus to the thermal cure apparatus. It is possible for the UV curing to be completed on the same platform or bonder on which the mounting of the laminate component is performed. However, thermal curing will generally not occur on the same bonder platform. A B-stage DA material itself generally provides sufficient adhesion for the laminate components on the pedestals of the LF to be transported from the device mount apparatus to the thermal cure apparatus.

Some high performance epoxies are formulated as B-stage systems. As known in polymer chemistry, a B-stage epoxy is a polymer-based system wherein the first reaction between the resin and the curing agent/hardener is purposely not completed. Due to this, the polymer system is in a partially cured stage and is thus sticky or tacky. When this polymer system is then reheated at elevated temperatures, the polymer cross-linking is completed and the system fully cures.

The B-stage adhesive material comprises a material with good adhesive properties (i.e., is sticky) when it is applied but not fully cured (e.g., the first stage), so that it can securely hold a laminate component during transfer operations from the device mount apparatus to the thermal cure apparatus. Generally, the B-stage DA material should be compatible with both the laminate component and the pedestal material that the laminate component is intended to be mounted on. By way of example, there are a number of commercially available B-stage epoxy compositions that are compatible with and adhere well to the back surface of laminate components and pedestals that can be used with disclosed aspects.

The UV cure in the case of a UV-curable DA material can be a flash UV cure (e.g. a fraction of a second or several seconds) provided on the mount apparatus after mounting which provides sufficient mechanical stability for the laminate components on the pedestals of the LF strip to be reliably transported from the mount apparatus to the thermal cure apparatus. The flash UV cure can be a conventional flash UV cure process. One example conventional UV curing process comprises using a center wavelength of 365 nm, an illumination of 60 to 80 mw/cm$^2$, a light amount of 200 mj/cm$^2$, and a time of 0.5 to 2 seconds. Next, a thermal cure (e.g., using an oven) takes place that renders the thermally curable DA material fully cured which in the case of a B-stage DA material essentially completes the curing of the B-stage material to provide additional adhesion between the pedestals and the laminate component. The laminate component can comprise a transformer or a HV capacitor, or another passive barrier component, where the laminate component can be part of a digital isolation device.

Traditional DA dispense methods can be used to add the DA materials such as an automated pump dispensing system, or a highly other controllable dispense method such as screen printing. The respective DA materials can comprise an outer ring of the first die attach material outside the thermally curable DA material, or side-by-side with the first DA material being on the outside of the thermally curable DA material as shown in FIG. 2B described below.

Disclosed DA methods using 2 different DA materials for laminate components on pedestals leverages the speed and ease of UV-curing or B-stage adhesives and combines it with the robustness and ultimate good adhesion delivered by typical thermal curing DA materials and curing processes. Disclosed methods allow for greater laminate component functionality through larger area features such as transformer coils enabled by reduced area LF pedestals. As noted above, in the case of a UV-curing DA material, the UV curing step can also be incorporated/programmed to be completed on the same platform or bonder apparatus on which laminate component mounting to the pedestals of the LFs is performed, which generally results in only a small increase in process cycle time due to the relative speed of typical UV curing processes.

FIG. 1 is a cross sectional depiction of a portion of an example packaged semiconductor device 100 showing a laminate component 110 that has bond pads on its top side shown as BP1 and BP2 secured with its top side up on a plurality of pedestals with pedestal 1 and pedestal 2 of a LF 140 shown. There are 2-different DA materials shown as DA1 and DA2 that are side-by-side, with DA1 being outside DA2, for securing the laminate component 110 to the pedestals. Although not shown, DA1 and DA2 may overlap at their interface. As noted above, DA1 comprises a UV-curable DA or a B-stage adhesive, and DA2 comprises a thermally curable DA material. Although not shown in FIG. 1, the packaged semiconductor device 100 also includes an IC die having die pads that generally use a separate DA step and separate DA material, such as for attachment to a die pad.

Although the FIGs. as noted above "are not necessarily drawn to scale", approximate thicknesses for the various components shown in FIG. 1 may be as follows. Regarding the thickness of the pedestals, pedestal 1 and pedestal 2 can be simply the full thickness region of the LF 140 which may be about 10 mils (0.254 mm) thick. The remaining portions of the LF 140 shown are generally half-etched regions, and thus may be about 5 mils (0.127 mm) thick. The cured DA material thickness may be about 1.5 mils (0.038 mm) thick. The laminate component 110 may be about 15 mils thick (0.38 mm). BP1 and BP2 on the laminate component 110 may be about 0.6 mils (0.015 mm) thick.

Figure 2A:
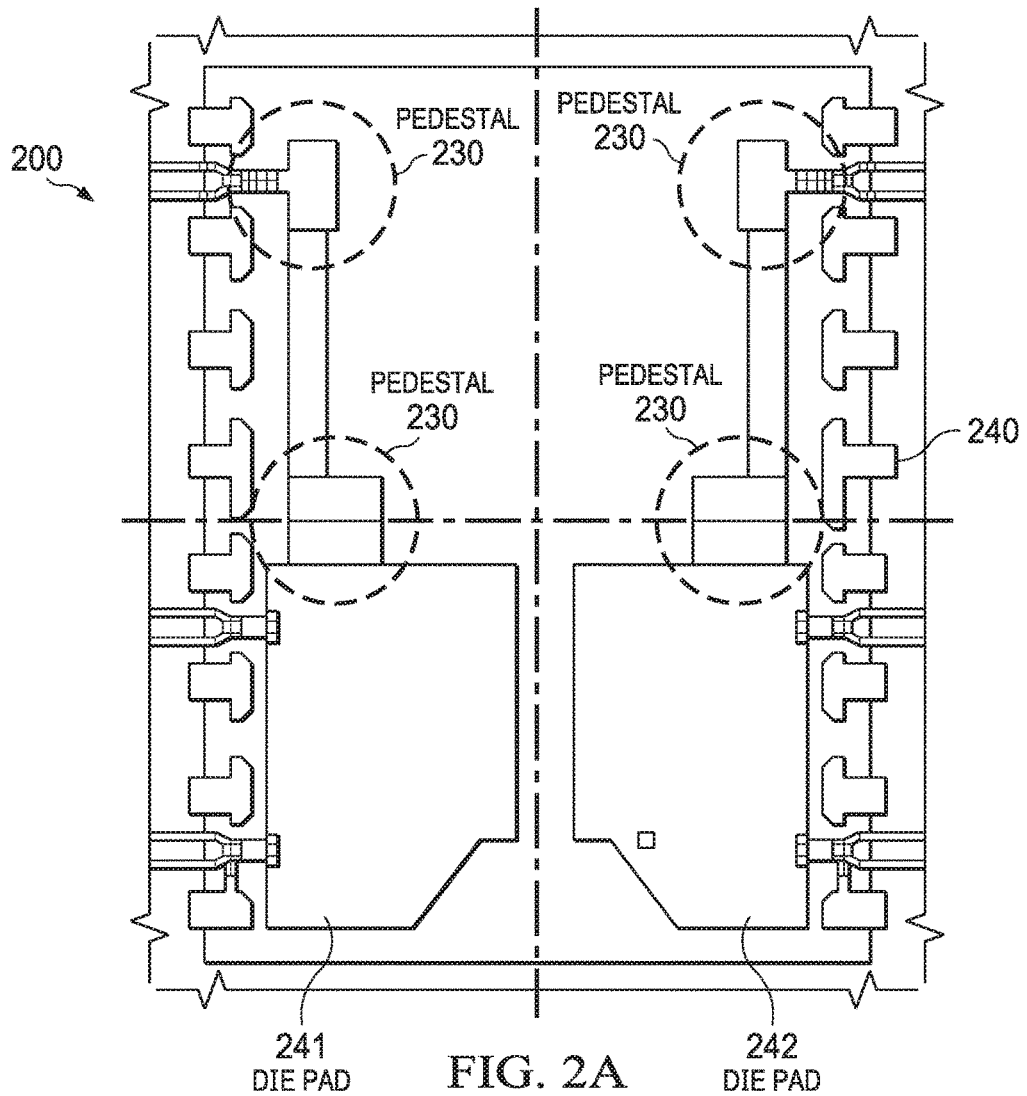
FIG. 2A shows a portion of a disclosed LF showing an arrangement of 4 disclosed reduced area pedestals, according to an example aspect.
Figure 2B:
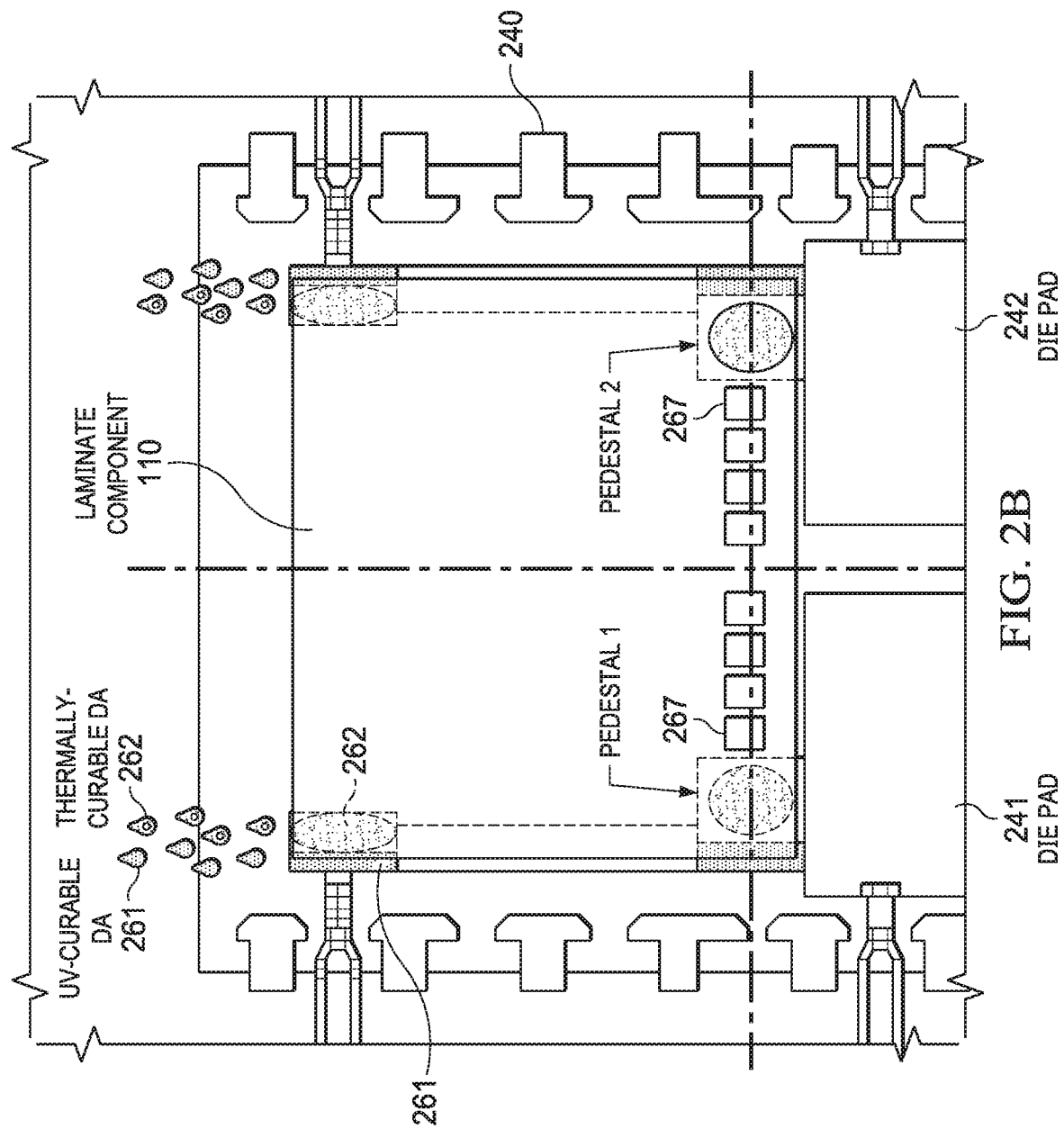
FIG. 2B shows a zoomed in view of the portion of a disclosed LF showing an arrangement of 4 disclosed reduced area pedestals in FIG. 2A, with a laminate component secured to the pedestals by 2-different DA materials shown as a UV-curable DA and a thermally-curable DA, with a depiction also showing the application of the respective DA materials, according to an example aspect.

FIG. 2A shows a portion of a LF 200 showing an arrangement of 4 disclosed reduced area pedestals 230, according to an example aspect. There can be more than 4 pedestals, or less than 4 pedestals. The area of the pedestals can be <500 µm$^2$. Although the pedestal shapes are shown being different on the top of the LF vs. the bottom of the LF, there is generally no need for pedestal shapes to be different on the top of the LF vs. the bottom of the LF. Leads 240 of the LF 200 associated with bonding to the top electrodes of the laminate component are also shown. Die pads 241 and 242 are shown that are for mounting an IC die.

FIG. 2B shows a zoomed in see-through view of the laminate component 110 of the portion of a disclosed LF showing an arrangement of 4 disclosed reduced area pedestals in FIG. 2A, with the laminate component 110 shown secured to the pedestals by 2-different DA materials that are side-by-side shown as a UV-curable DA 261 on the outside and a thermally-curable DA 262 on the inside. This depiction also shows the dispensing (e.g., printing) of the respective DA materials. The laminate component 110 is shown having bond pads 267 on its top side.

Figure 3:
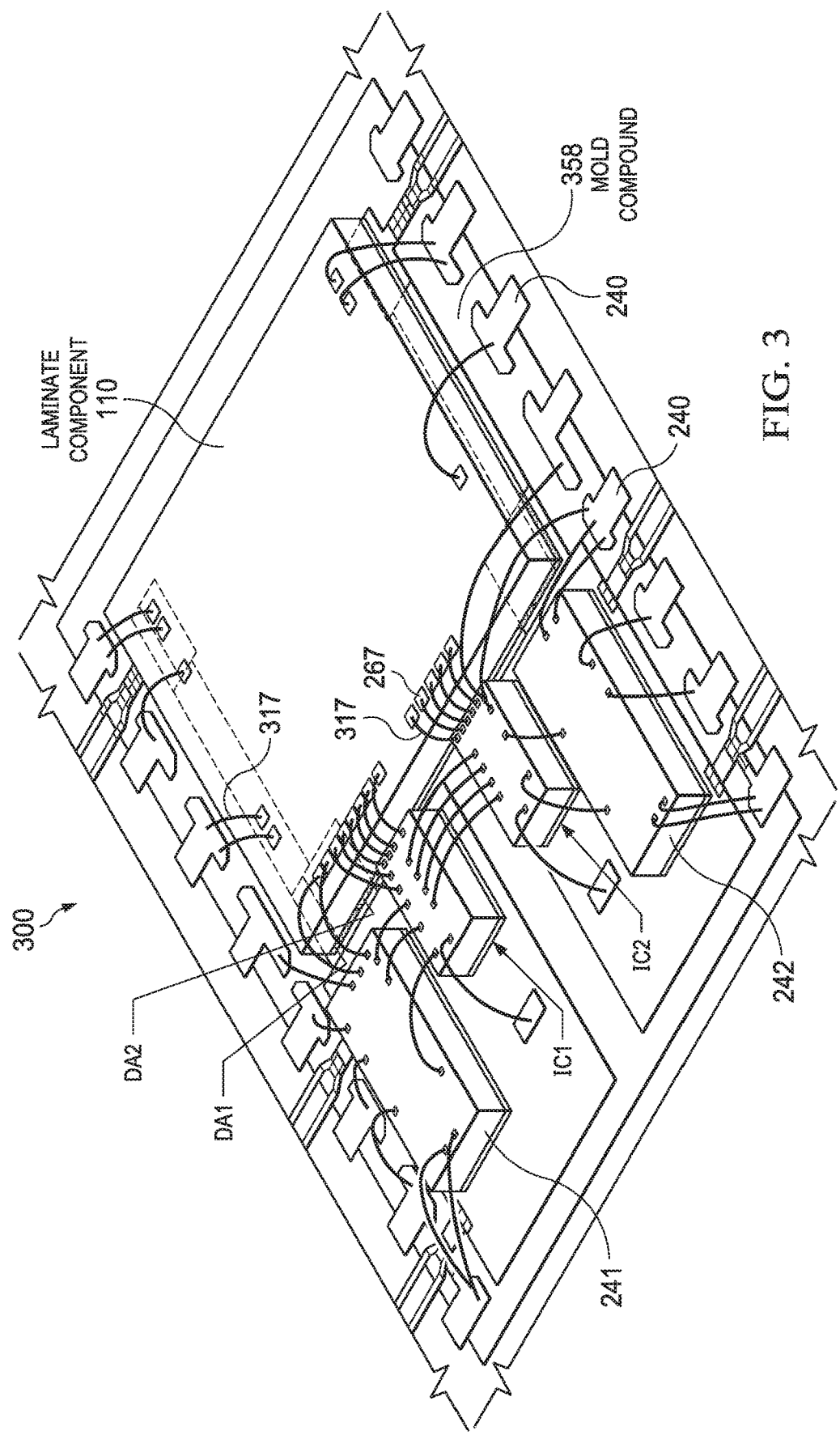
FIG. 3 is an isometric view of an exampled packaged multi-chip semiconductor device including a laminate component secured to pedestals of a LF by 2-different DA materials.

FIG. 3 is an isometric view of an exampled packaged multi-chip semiconductor device 300 including a laminate component 110 secured to pedestals of a LF with 2-different DA materials DA1, DA2. Bond wires 317 are shown between bond pads 267 on the laminate component 110 and IC 1 and IC 2, which for when the packaged multi-chip semiconductor device 300 comprises an isolation device generally comprises a transmitter and a receiver, as well as a third IC being a controller. There is a molding compound 358 shown as a "mold compound" that is generally applied after die attach to the LF strip for encapsulating a plurality of packaged multi-chip semiconductor devices including the packaged multi-chip semiconductor device 300. After molding, as known in the art, a singulating process (e.g., mechanical saw or laser) separates individual LFs from the LF strip.

EXAMPLES

Disclosed embodiments are further illustrated by the following specific Examples, which should not be construed as limiting the scope or content of this Disclosure in any way.

Figure 4:
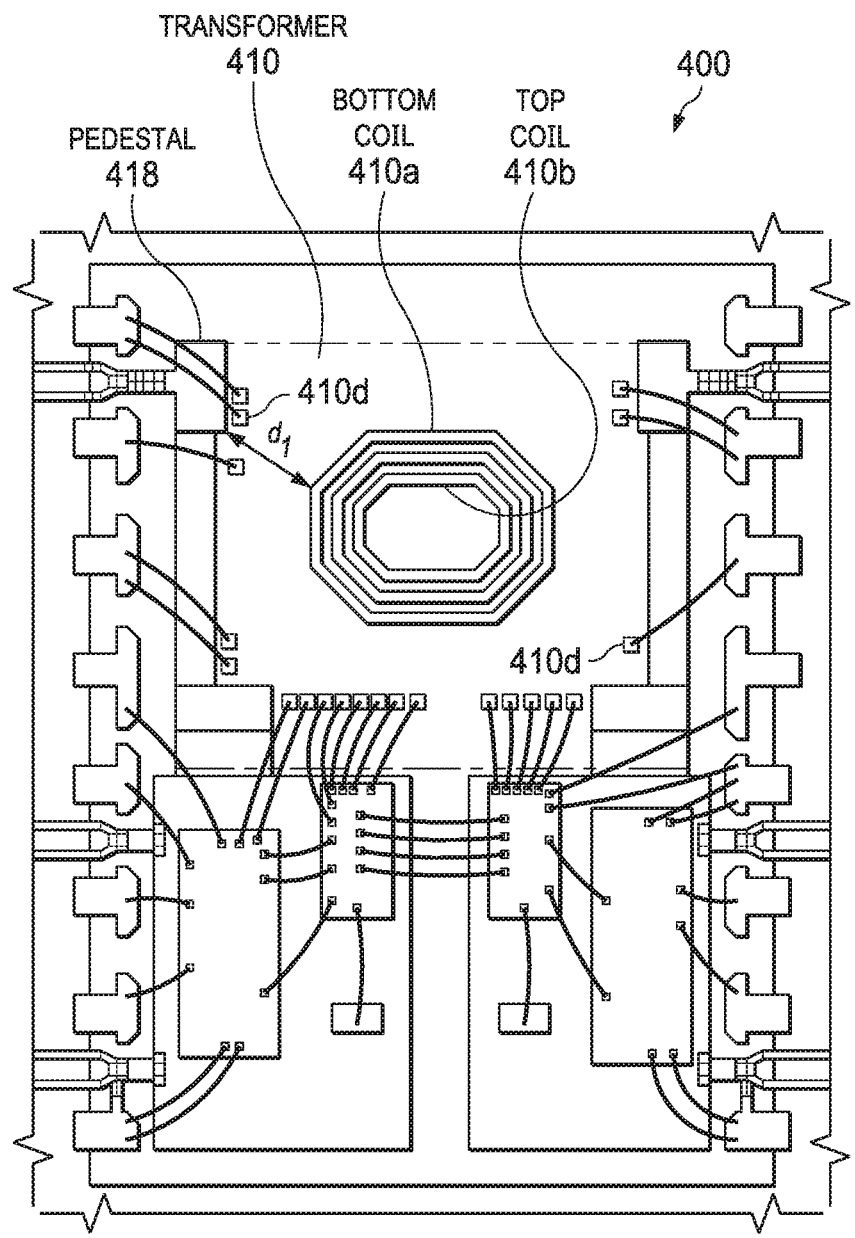
FIG. 4 is a depiction of the packaged multi-chip semiconductor device shown in FIG. 3 with the transformer component in the laminate device with its closest metal coil to the LF shown that is secured to pedestals of a LF with 2-different DA materials, showing the clearance as di between the LF pedestal and the closest metal coil.

FIG. 4 is a depiction of the packaged multi-chip semiconductor device 300 shown in FIG. 3 now shown as multi-chip semiconductor device 400 with the laminate component now shown as a transformer 410 that is secured to pedestals 418 of a LF with 2-different DA materials (DA materials not shown). Bond pads of the transformer 410 are shown as 410d, and its lowest level coil shown from a see-through view as bottom coil 410a and the top coil as 410b. Although the respective coils generally have the same area, the respective coils are shown with increasing area moving downward from the top coil 410b to the bottom coil 410a to allow FIG. 4 to show each of the coils. Regarding the clearance between the LF and the transformer's 410 closest metal layer, here shown as di between the outer edge of the bottom coil 410a that is closest to the pedestal 418.

During operation of the multi-chip semiconductor device 400, the transformer 410 and the LF including its pedestals can be at significantly different potentials, typically thousands of volts, so that they need to maintain a minimum distance to prevent electric (E)-field interactions from negatively impacting the overall performance of the device, such as by damaging dielectric layers in the path of the E field lines. As noted above, the clearance is the smallest distance from the closest metal layer feature to the closest edge of the LF, shown as di. Reducing the physical area of the LF pedestals enables semiconductor packaging device designers to increase the area of the laminate component features such as coils of a transformer, thus enhancing device performance, while still meeting clearance requirements. Reducing the area of the pedestals also limits the amount of physical area available to support the laminate component, which disclosed DA arrangements address with improved adhesion.

Assume the transformer 410 or other laminate component is 4 mm across, and the minimum spacing from the edge of the pedestal 418 to the edge of the bottom coil 410a is 680 µm. The pedestal 418 generally extends beyond the bond pad of the transformer 410' or other laminate component, so that the actual usable area for the coils in this example is about 2.7 mm. Using a conventional single thermally curing DA material for mounting the a laminate transformer to the pedestals of a LF, engineering evaluations performed showed about 25% of the transformers on a LF strip are displaced or popped off of the LF pedestals prior to mount cure, which prevents the implementation of smaller area pedestals, and thus limiting the functional capability of these devices as it is known the area coils such as coil 410a and 410b is proportional to the coil efficiency (not linearly related, but highly correlated). Accordingly, extra area enabled for the coils directly results in a transformer efficiency improvement.

Now if it is assumed that the multi-chip semiconductor device 400 is enabled by disclosed DA arrangements described in this Disclosure so that a reduction in the area of the pedestals 418 is implemented from about 625 µm$^2$ to 400 µm$^2$, this effectively allows design of the metal coils to be extended out 400 µm$^2$, so that the new area of the metal coil 410a can be 3.5 mm. That is about a 40% improvement in area utilization (2.7 mm×2.7 mm vs 3.5 mm×3.5 mm) for the metal coils, which would also be reflected in the metal coils in all the other metal layers. Engineering evaluations performed confirmed less than 5% of the transformers on a LF strip are displaced or popped off of the LF pedestals prior to mount cure, which enables the implementation of smaller area pedestals. For dual-coil designs (2 coils on each metal layer) which some isolation devices may use, with each coil being smaller more constrained in area, smaller LF pedestals enabled by this Disclosure would allow for an even larger transformer % efficiency benefit.

Disclosed embodiments can be integrated into a variety of assembly flows to form a variety of different semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many other embodiments and variations of embodiments are possible within the scope of the claimed invention, and further additions, deletions, substitutions and modifications may be made to the described embodiments without departing from the scope of this Disclosure.

The invention claimed is:

1. A method of assembling a semiconductor device, comprising:
    providing a leadframe (LF) strip having a plurality of LFs each with a plurality of laminate-supporting pedestals;
    adding a first die attach (DA) material comprising an ultraviolet (UV)-curing DA material or a B-stage DA material on an outer edge of the plurality of pedestals;
    adding a thermally-curing DA material on an area of the plurality of pedestals not occupied by the UV-curing DA material;
    mounting a laminate component having bond pads on a top side with the top side up on the plurality of pedestals, and
    thermally curing to cure the thermally-curing DA material.

2. The method of claim 1, wherein the first DA material comprises the UV-curing DA material, further comprising before the thermally curing UV curing to cure the UV-curing DA material.

3. The method of claim 1, wherein the plurality of LFs further comprise a first and at least a second die pad, and wherein the mounting further comprises mounting a first integrated circuit (IC) on the first die pad and a second IC on the second die pad, and wherein the method further comprises:
adding bond wires between bond pads on the first IC and the LF, bond pads on the second IC and some of the bond pads on the laminate component, and between other of the bond pads on the laminate component and the LF;
molding the LF strip with a molding compound, and
singulating the plurality of LFs from the LF strip.

4. The method of claim 1, wherein the laminate component comprises a transformer including at least two coils comprising a top coil and a bottom coil.

5. The method of claim 2, wherein both the mounting a laminate and the UV curing are programmed to be completed on the same platform or bonder.

6. The method of claim 2, wherein the thermally-curing DA material and the UV-curing DA material both comprise epoxy resins, with only the UV curing DA material including a UV photoinitiator.

7. The method of claim 1, wherein a total area of the plurality of pedestals is <500 µm².

8. The method of claim 1, wherein the semiconductor device comprises a digital isolation device.

9. The method of claim 1, wherein the first DA material and the thermally-curing DA material are side-by-side.

10. A packaged semiconductor device, comprising:
a leadframe (LF) having a plurality of laminate-supporting pedestals;
a cured first die attach (DA) material on an outer edge of the pedestals comprising an ultraviolet (UV)-curing DA material having a photoinitiator or a cured B-stage DA material;
a cured thermally-curing DA material on an area of the pedestals not occupied by the UV-curing DA material, and
a laminate component mounted having bond pads on a top side with the top side up on the plurality of pedestals.

11. The packaged semiconductor device of claim 10, wherein the laminate component comprises a transformer including at least a top coil and a bottom coil.

12. The packaged semiconductor device of claim 10, wherein the first DA material comprises the UV-curing DA material.

13. The packaged semiconductor device of claim 10, wherein the LF further comprise a first and at least a second die pad, and wherein a first integrated circuit (IC) is mounted on the first die pad and a second IC is mounted on the second die pad, further comprising:
bond wires between bond pads on the first IC and the LF, bond pads on the second IC and some of the bond pads on the laminate component, and between other of the bond pads on the laminate component and the LF, and
a molding compound encapsulating the packaged semiconductor device.

14. The packaged semiconductor device of claim 12, wherein the thermally-curing DA material and the UV-curing DA material both comprise epoxy resins.

15. The packaged semiconductor device of claim 10, wherein a total area of the plurality of pedestals is <500 µm².

16. The packaged semiconductor device of claim 10, wherein the first IC comprises a transmitter, the second IC comprises a receiver, and the semiconductor device comprises a digital isolation device.

17. The packaged semiconductor device of claim 16, wherein the packaged semiconductor device further comprises a controller IC.

18. The packaged semiconductor device of claim 10, wherein the first DA material and the thermally-curing DA material are side-by-side.

19. The packaged semiconductor device of claim 10, wherein the thermally-curing DA material and the UV-curing DA material both comprise epoxy resins, with only the UV-curing DA material including a UV photoinitiator.

20. A method of assembling a semiconductor device, comprising:
providing a leadframe (LF) with a plurality of laminate-supporting pedestals;
adding a first die attach (DA) material comprising an ultraviolet (UV)-curing DA material or a B-stage DA material on an outer edge of the plurality of pedestals;
adding a thermally-curing DA material on an area of the plurality of pedestals not occupied by the UV-curing DA material;
mounting a laminate component having bond pads on a top side with the top side up on the plurality of pedestals, and
thermally curing to cure the thermally-curing DA material.

21. A method of making a packaged semiconductor device, comprising:
providing a leadframe (LF) having a plurality of laminate-supporting pedestals;
forming a cured first die attach (DA) material on an outer edge of the pedestals comprising an ultraviolet (UV)-curing DA material having a photoinitiator or a cured B-stage DA material;
forming a cured thermally-curing DA material on an area of the pedestals not occupied by the UV-curing DA material, and
mounting a laminate component having bond pads on a top side with the top side up on the plurality of pedestals.

22. The method of claim 21, wherein the laminate component comprises a transformer including at least a top coil and a bottom coil.

23. The method of claim 21, wherein the first DA material comprises the UV-curing DA material.

24. The method of claim 21, wherein the LF further comprise a first and at least a second die pad, and wherein a first integrated circuit (IC) is mounted on the first die pad and a second IC is mounted on the second die pad, further comprising:
bond wires between bond pads on the first IC and the LF, bond pads on the second IC and some of the bond pads on the laminate component, and between other of the bond pads on the laminate component and the LF, and
a molding compound encapsulating the packaged semiconductor device.

25. The method of claim 23, wherein the thermally-curing DA material and the UV-curing DA material both comprise epoxy resins.

26. The method of claim 21, wherein a total area of the plurality of pedestals is <500 µm².

27. The method of claim 21, wherein the first IC comprises a transmitter, the second IC comprises a receiver, and the semiconductor device comprises a digital isolation device.

28. The method of claim 27, wherein the packaged semiconductor device further comprises a controller IC.

29. The method of claim 21, wherein the first DA material and the thermally-curing DA material are side-by-side.

30. The method of claim 21, wherein the thermally-curing DA material and the UV-curing DA material both comprise epoxy resins, with only the UV-curing DA material including a UV photoinitiator.

\* \* \* \* \*